(12) United States Patent
Syllaios et al.

(10) Patent No.: US 7,528,061 B2
(45) Date of Patent: May 5, 2009

(54) SYSTEMS AND METHODS FOR SOLDER BONDING

(75) Inventors: Athanasios J. Syllaios, Richardson, TX (US); John H. Tregilgas, Richardson, TX (US); Roland W. Gooch, Dallas, TX (US)

(73) Assignee: L-3 Communications Corporation, New York, NY (US)

( * ) Notice: Subject to any disclaimer, the term of this patent is extended or adjusted under 35 U.S.C. 154(b) by 384 days.

(21) Appl. No.: 11/141,361

(22) Filed: May 31, 2005

(65) Prior Publication Data

US 2006/0128136 A1 Jun. 15, 2006

Related U.S. Application Data

(60) Provisional application No. 60/635,060, filed on Dec. 10, 2004.

(51) Int. Cl.
*H01L 21/44* (2006.01)
(52) U.S. Cl. ............... 438/612; 438/613; 438/614; 438/615
(58) Field of Classification Search .......... 438/612–615
See application file for complete search history.

(56) References Cited

U.S. PATENT DOCUMENTS 4,623,086 A * 11/1986 Tihanyi et al. ............ 228/123.1
6,334,567 B1 * 1/2002 Xie et al. ................. 228/110.1
6,521,477 B1   2/2003 Gooch et al.
6,586,831 B2   7/2003 Gooch et al.
2004/0067604 A1 * 4/2004 Ouellet et al. ............ 438/108
2004/0147056 A1 * 7/2004 McKinnell et al. ......... 438/52
2004/0219704 A1  11/2004 Syllaios et al.

OTHER PUBLICATIONS

Runyan et al., "Semiconductor Integrated Circuit Processing Technology," Addison-Wesley Publishing Company, Inc., May 1994, pp. 252-258.
S.M. Henrich, "The Mechanics Of Solder Alloy Interconnects," Chapman & Hall, Chapter 5, 1994, pp. 158-162.
Hoban et al., "Soldering", http://et.nmsu.edu/~etti/spring97/electronics/solder/solder.html, Technology Interface, Spring 1997, 8 pgs.
"General Soldering Information", http://www.qsl.net/n9zia/solder.html, undated- printed from Internet on Oct. 12, 2005, 6 pgs.
Search Report, PCT/US05/43650, Jun. 17, 2008, 3 pgs.

* cited by examiner

*Primary Examiner*—Alexander G Ghyka
*Assistant Examiner*—Angel Roman
(74) *Attorney, Agent, or Firm*—O'Keefe, Egan, Peterman & Enders LLP (57) ABSTRACT

Systems and methods for solder bonding that employ an equilibrium solidification process in which the solder is solidified by dissolving and alloying metals that raise the melting point temperature of the solder. Two or more structure surfaces may be solder bonded, for example, by employing heating to melt the solder and holding the couple at a temperature above the initial solder melting point of the solder until interdiffusion reduces the volume fraction of liquid so as to form a solid bond between surfaces before cooling to below the initial melting point of the solder.

31 Claims, 4 Drawing Sheets

SYSTEMS AND METHODS FOR SOLDER BONDING

This patent application claims priority to U.S. Provisional patent application Ser. No. 60/635,060, filed Dec. 10, 2004, and entitled "SYSTEMS AND METHODS FOR SOLDER BONDING" by Syllaios et al., the entire disclosure of which is incorporated herein by reference.

BACKGROUND OF THE INVENTION

1. Field of the Invention

This invention relates generally to solder bonding, and more particularly to solder bonding for device packaging.

2. Description of the Related Art

Microelectromechanical systems (MEMS) are integrated micro devices or systems combining electrical and mechanical components. Some MEMS devices may be fabricated using standard integrated circuit batch processing techniques and have a variety of applications including sensing, controlling and actuating on a micro scale. MEMS devices may function individually or in arrays to generate effects on a macro scale.

Certain MEMS devices require a vacuum environment in order to obtain maximum performance. The vacuum package also provides protection in an optimal operating environment for the MEMS device. Examples of these MEMS devices are infrared MEMS such as bolometers and certain inertial MEMS such as gyros and accelerometers. Solder is often used as a sealing material for forming a vacuum package around a MEMS device. In a wafer bonding process, a lid wafer is aligned and mounted to a device wafer with an annular seal ring of solder to form an enclosed cell at each die location. This lid attachment process is completed in a vacuum environment, leaving each MEMS device in a vacuum cell. In this regard, wafer bonding for vacuum packaging of semiconductor devices requires soldering at low temperatures, normally 300 to 350° C. or lower. Past soldering methods include wetting and quenching of the solder, which can result in poor adhesion and high stress bonds.

SUMMARY OF THE INVENTION

Disclosed herein are systems and methods for solder bonding, e.g., for purposes of vacuum packaging of semiconductor devices. The disclosed systems and methods employ a process not requiring a decrease in temperature to obtain solidification of melted solder. In one embodiment, the disclosed systems and methods may employ an equilibrium isothermal solidification process in which the solder is solidified by dissolving and alloying metals that raise the melting temperature of the solder. Because the disclosed systems and methods are equilibrium processes (e.g., isothermal thermal equilibrium processes), reproducible soldering results may be advantageously achieved. This is in contrast to wet and quench methods that do not control the solidified phase.

In one embodiment, the disclosed systems and methods may be implemented to employ a relatively thin layer of lower melting point solder between two higher melting point surfaces (typically composed of relatively thick metal layers), heating such couple to melt the solder and alloying it with the adjacent surfaces during an isothermal anneal. By holding the solder couple at a fixed temperature for a period of time, liquid in the solder dissolves a portion of the adjacent substrate shifting the composition of the melt so as to reduce the volume fraction of liquid until an essentially solid metallurgical junction is formed. During this process, elemental components from the molten liquid solder diffuse into the adjacent solid until local equilibrium is established. By having relatively thick capping layers to absorb components from the solder, the couple may become solid during the isothermal anneal. With this process, reproducible soldering results may be advantageously achieved. One advantage of such a process is that it prevents deep erosion of metal layers necessary for good bonding to a surface and prevents pitting of the underlying substrate surface. This is in contrast to conventional soldering which employs cooling to solidify the solder joint, where significant bonding metallization attack can occur.

The disclosed systems and methods may be advantageously implemented in a variety of applications, including for the packaging of semiconductor devices, microelectromechanical systems (MEMS), optical detectors, etc. Specific examples include, but are not limited to, vacuum packaging of infrared detectors and MEMS devices, such as radio frequency (RF) switches, digital micromirror devices (DMD), manufacture of microbolometer based cameras (e.g., wafer level vacuum packaging of a-silicon microbolometer devices), etc. Suitable applications also include manufacture of sensors and focal plane arrays, e.g., large area multi-color cooled infrared diode detector arrays, or uncooled long wave infrared (LWIR) avalanche photodiodes (APD).

In one embodiment of the disclosed systems and methods, semiconductor devices may be vacuum packaged by solder bonding a lid structure to a semiconductor device using isothermal dissolution of metals coated on the bond surface of each of the device and lid structures. The lid structure may be of the same material as the semiconductor device, and bonding may occur at the wafer level, e.g., a device and corresponding lid structure may each be a silicon wafer. For example, a silicon device wafer may be bonded to a silicon lid wafer using a solder layer. A metal coating may be provided on each silicon wafer surface as a stack that includes an adhesion layer in contact and adhering to the silicon wafer, a barrier layer to prevent the solder from reacting with and eroding the silicon wafer, and a solderable top layer that is to be dissolved into the solder layer to form an alloy composition having a higher melting point than the initial solder composition, i.e., the alloy composition solidifies at a higher melting temperature than the melting point of the initial solder layer composition.

In one respect, disclosed herein is a method of solder bonding and an assembly manufactured therewith, the method including bonding a first structure to a second structure by solidifying melted solder, wherein the melted solder is solidified by dissolving and alloying metals to raise the melting point temperature of the melted solder.

In another respect, disclosed herein is a method of vacuum packaging semiconductor devices and a vacuum packaged assembly manufactured therewith, the method including: providing a semiconductor device wafer and a lid wafer, the semiconductor device wafer including a plurality of semiconductor device areas, and each of the semiconductor device wafer and the lid wafer including a solderable top layer; positioning the semiconductor device wafer adjacent the lid wafer in a vacuum with a solder layer having an initial composition being disposed therebetween, and so that the solderable top layer of the semiconductor device wafer and the solderable top layer of the lid wafer are each in contact with the solder layer; melting the solder layer; and then solidifying the melted solder layer to bond the semiconductor device wafer to the lid wafer in the vacuum, wherein the melted solder layer is solidified by dissolving the solderable top layer of each of the device structure and the lid structure into the solder layer to form an alloy composition having a higher melting point temperature than the initial solder layer composition to cause the alloy composition of the solder layer to solidify. The solidified solder layer surrounds at least one of the semiconductor device areas to form a vacuum package around the semiconductor device area between the semiconductor device wafer and the lid wafer.

In another respect, disclosed herein is a method of solder bonding and an assembly manufactured therewith, the method including: providing a first bondable component, the first bondable component having a solderable surface including a first solderable material and having a first melting point temperature; providing a solder component in contact with the solderable surface of the first bondable component, the solder component including a solder material and having a second melting point temperature that is lower than the first melting point temperature, the solderable surface of the first bondable component being in contact with the solder component at a first temperature that is below the second melting point temperature; raising the temperature of the solder component from the first temperature to a second temperature while the solder component is in contact with the solderable surface of the first bondable component, the second temperature being above the first melting point temperature and below the second melting point temperature; allowing the solder component to melt while the solder component is in contact with the solderable surface of the first bondable component; and allowing at least a portion of the first solderable material to transfer at the second temperature from the solderable surface of the first bondable component to the solder component to raise the melting point temperature of the solder component to a temperature above the second temperature so that the solder component solidifies as a bonding material that bonds to the solderable surface of the first solderable component at the second temperature.

In another respect, disclosed herein is a method of solder bonding two structure surfaces and an assembly manufactured therewith, the method including bonding a first structure surface to a second structure surface by melting a solder layer between the first and second structure surfaces and allowing interdiffusion with the first and second structure surfaces to reduce the volume fraction of melted liquid to form a solid metallurgical bond between the first and second structure surfaces while holding the first and second structure surfaces at a temperature above the initial solder melting point temperature.

DETAILED DESCRIPTION OF THE INVENTION

Infrared microelectromechanical systems (MEMS) devices may require a vacuum, or other suitably manipulated environment, to obtain either operability or maximum performance. For example, infrared micro bolometers require an operating pressure of less than 10 millitorr to minimize thermal transfer from the detector elements to the substrate and packaging walls. Additionally, infrared micro bolometers require an optically-transparent cover. However, although the embodiments disclosed herein discuss integrated circuit fabrication in terms of vacuum packaging for infrared MEMS devices, embodiments of the disclosed systems and methods may be used to provide vacuum packaging of any integrated circuit device, or similar device, formed on a substrate material and contained within a vacuum package. Additionally, the disclosed systems and methods may be used in any vacuum or non-vacuum packaging of integrated circuit devices. Examples include, but are not limited to, microelectronic devices such as semiconductor devices, MEMs, RF detection devices, uncooled or cooled long wavelength (about 7-14 um) infrared (LWIR) detector array devices, uncooled or cooled mid wavelength (about 3-5 um) infrared (MWIR) detector array devices, multi-color (e.g., LWIR and MWIR) uncooled or cooled infrared bolometer or diode detector array devices, uncooled or cooled avalanche photodiode (APD) detector array devices, etc.

Figure 1:
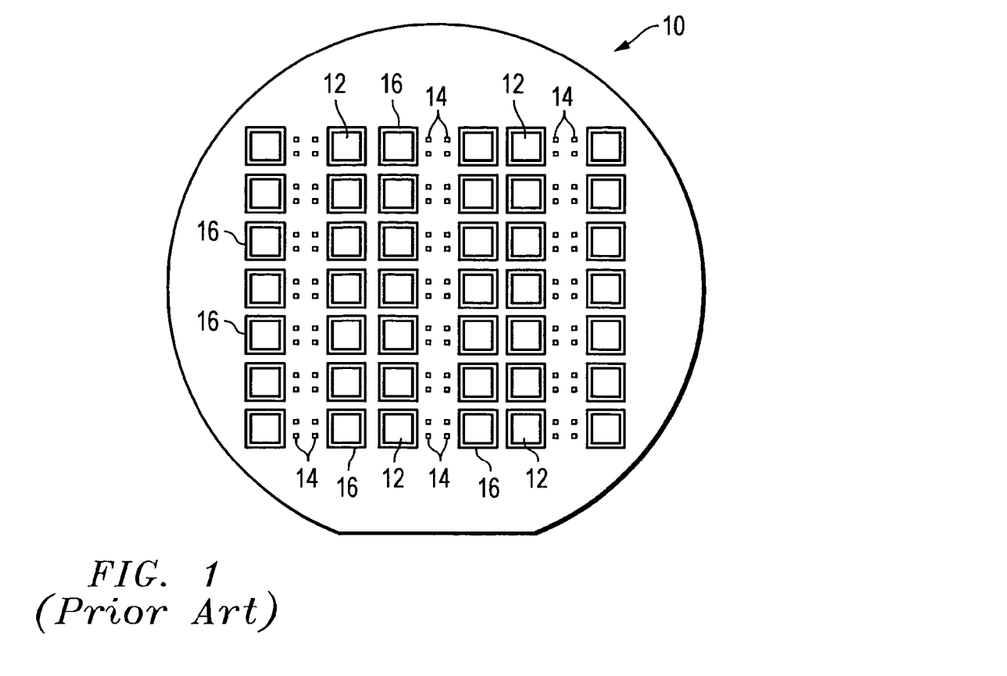
FIG. 1 is a top view of a device wafer of the prior art of the type with which the disclosed systems and methods may be implemented in one exemplary embodiment.

FIG. 1 illustrates one type of silicon device wafer 10 of the prior art with which features one of the disclosed systems and methods may be implemented in one exemplary embodiment. In FIG. 1, silicon device wafer 10 is a standard substrate used for fabrication of integrated circuit devices, MEMS devices, or similar devices. However, any suitable substrate material may be used. For example, a substrate material with integrated circuit readout devices embedded therein may be used as the device wafer 10. As shown in FIG. 1, silicon device wafers usually have many MEMS devices 12 formed thereon using traditional methods of integrated circuit fabrication.

Still referring to FIG. 1, each MEMS device 12 is shown having one or more associated bonding pads 14 which provide electrical connections to the MEMS device 12. These bonding pads 14 may be disposed only on one side of the MEMS device 12, but bonding pads 14 may also be disposed on any side, one side, or multiple sides of MEMS device 12. In addition to device wafer 10, MEMS devices 12, and bonding pads 14, FIG. 1 also depicts sealing surface 16, which defines the vacuum package around a MEMS device 12. Although one MEMS device is enclosed in each vacuum package of FIG. 1, it is readily understood that multiple MEMS devices may be enclosed within a vacuum package defined by sealing surface 16.

Figure 2:
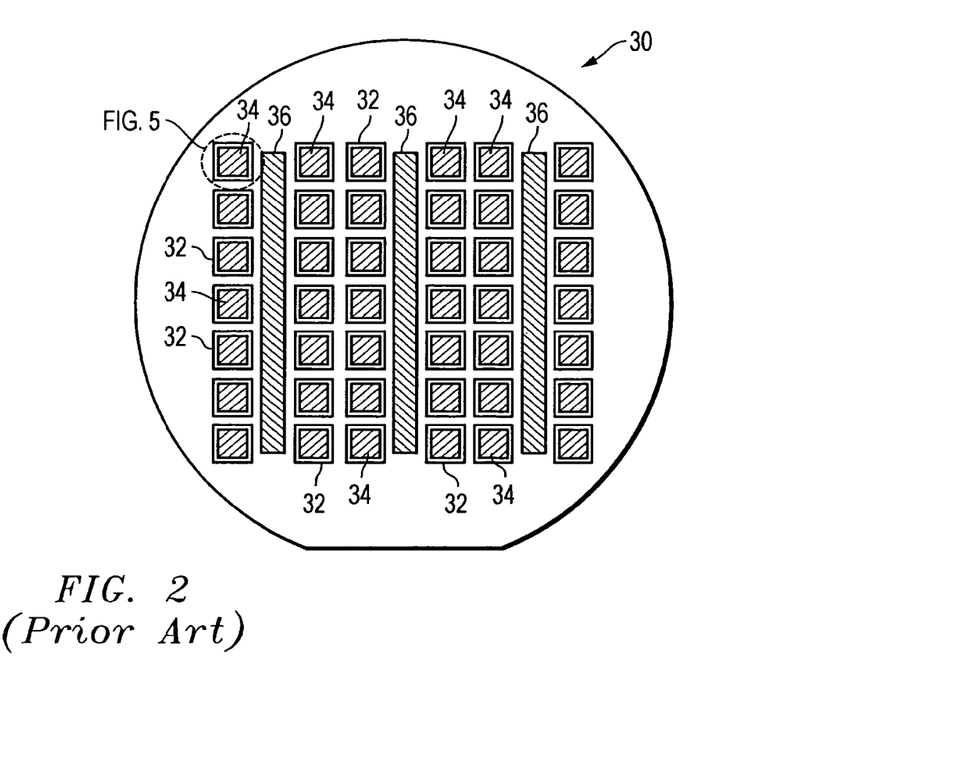
FIG. 2 is a top view of a lid wafer of the prior art of the type with which the disclosed systems and methods may be implemented in one exemplary embodiment.

FIG. 2 illustrates a one type of silicon lid wafer 30 of the prior art with which features of the disclosed systems and methods may be implemented in one exemplary embodiment. Although the description below utilizes a silicon wafer as a substrate for the lid wafer 30, any suitable substrate material may be used. Examples of materials other than silicon which may be used as optically-transparent device wafer lids include quartz or Pyrex, zinc selenide, zinc sulfide, germanium, sapphire, or infrared chalcogenide glasses (e.g., Ge—Sb—Se). Lid wafer 30 includes a plurality of lid sealing surfaces 32, preferably corresponding in number to the device sealing surfaces 16 on device wafer 10. Each of the lid sealing surfaces 32 is preferably a mirror image of a respective device sealing surface 16 so that lid wafer 30 mates with device wafer 10. Cavities 34 and bonding pad channels 36 are etched in the lid wafer 30 using an appropriate etching process such as wet or dry etching. Additionally, trenches 42 shown in FIG. 5 may be etched in lid wafer 30. Trenches 42 are preferably disposed in sealing surfaces 32 in order to prevent any sealing material from entering cavities 34. Anisotropic etching using potassium hydroxide (KOH), or any other suitable basic solution may be used to etch cavities 34, bonding pad channels 36, and trenches 42, e.g., see W. R. Runyan and K. E. Bean, "Semiconductor Integrated Circuit Processing Technology", Addison-Wesley, 1994, pages 252-258. The etching process for cavities 34, bonding pad channels 36, and trenches 42 may include depositing a layer of silicon nitride and patterning the silicon nitride layer to form an appropriate etch mask.

Figure 3:
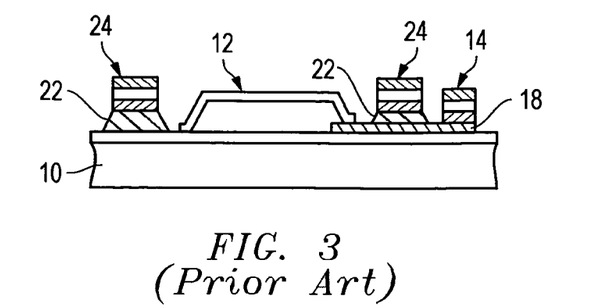
FIG. 3 is a cross section of a single MEMS device of the prior art of the type with which the disclosed systems and methods may be implemented in one exemplary embodiment.
Figure 4:
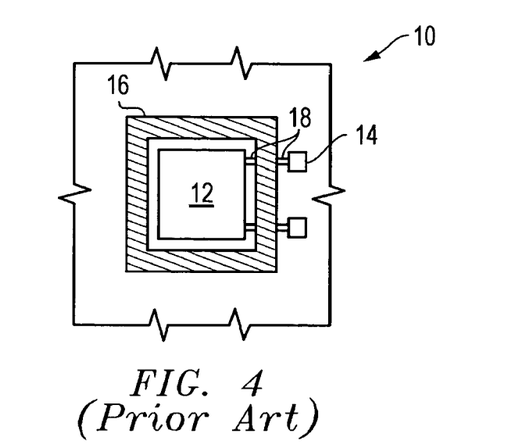
FIG. 4 is a top view of a single MEMS device of the prior art of the type with which the disclosed systems and methods may be implemented in one exemplary embodiment.

Referring now to FIGS. 3 and 4, one type of single MEMS device 12 of the prior art is illustrated to more completely show the layout on device wafer 10 of FIG. 1 with which the disclosed methods and systems may be implemented in one exemplary embodiment. A lead 18 connects each bonding pad 14 to MEMS device 12. A space is left between MEMS device 12 and bonding pad 14 to form the device sealing surface 16. Note that lead 18 runs beneath fabrication layers to be built within device sealing surface 16. Because the device sealing surface 16 defines the area of the device wafer 10 within which a vacuum package will be formed, leads 18 form electrical connections to bonding pads 14 without affecting the vacuum seal existing around MEMS device 12.

Still referring to FIGS. 3 and 4, device sealing surface 16 (FIG. 4) is formed on device wafer 10 (FIG. 4) such that a sealing layer 22 and bonding adhesion surface 24 may be formed thereon. Sealing layer 22 may be comprised of any suitable material having dielectric properties. Sealing layer 22 serves as a platform upon which bonding adhesion surface 24 may be deposited and may be composed of silicon nitride, although any suitable dielectric may be used. Sealing layer 22 provides electrical isolation for leads 18.

Bonding adhesion surface 24 is fabricated on sealing layer 22 and may be fabricated using any combination of metal, metal alloy or other material that is suitable for bonding device wafer 10 and lid wafer 30 together, e.g., as a metal stack such as described hereinbelow. Bonding adhesion surface 24 comprises a first layer of titanium, a second layer of platinum, and a third layer of gold. However, there are many suitable materials or combinations of materials available for use in fabricating bonding adhesion surface 24. Bonding adhesion surface 24 may be deposited at the same time bonding pads 14 are deposited on device wafer 10. As described further herein, device sealing surface 16 may utilize a heat-activated eutectic solder layer.

Figure 5:
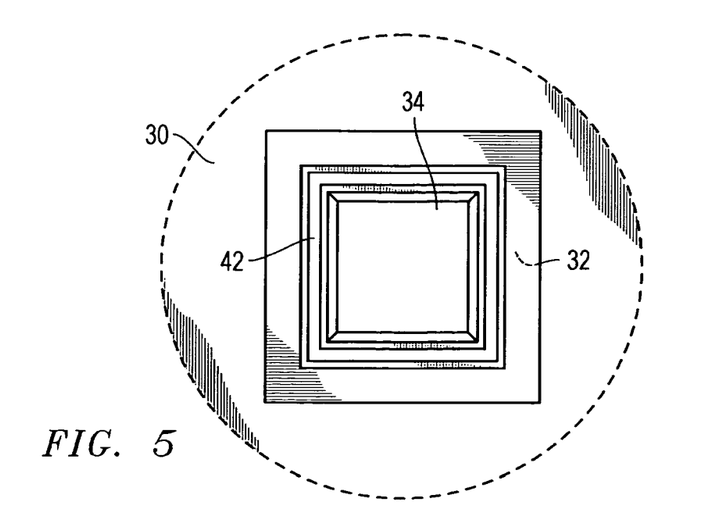
FIG. 5 is an enlarged view of a portion of a lid wafer according to one exemplary embodiment of the disclosed systems and methods.

FIG. 5 illustrates an enlarged view of a portion of one embodiment of a lid wafer 30 that may be operable to form the lid portion of a single vacuum packaged MEMS device. FIG. 5 is a view of the interior of an individual cavity 34 on lid wafer 30. Sealing surface 32, cavity 34, diffractive antireflection etched array 44, and trench 42 are illustrated in accordance with an embodiment of the present invention.

Further information on techniques for manufacturing vacuum packaged assemblies that may be employed in conjunction with the disclosed systems and methods may be found in U.S. Pat. Nos. 6,586,831 and 6,521,477, and in U.S. patent application Ser. No. 10/428,745 published as Patent Publication number 2004/0219704, all three of which references are incorporated herein by reference.

Figure 6:
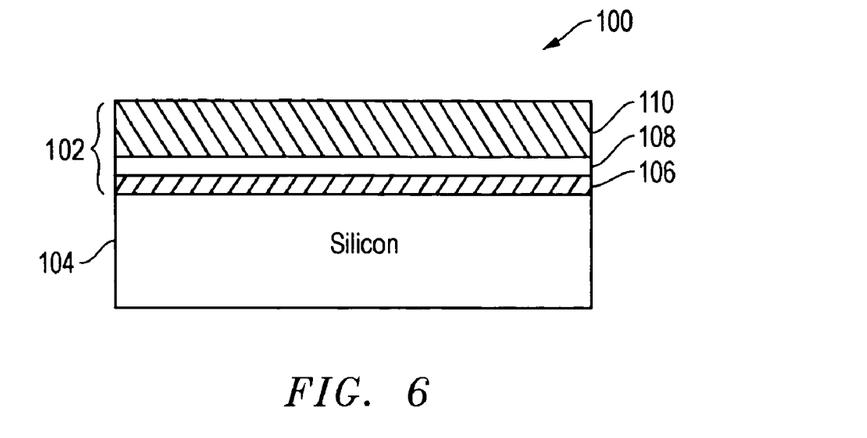
FIG. 6 is a simplified cross-sectional view of a stackup configuration according to one exemplary embodiment of the disclosed systems and methods.
Figure 7:
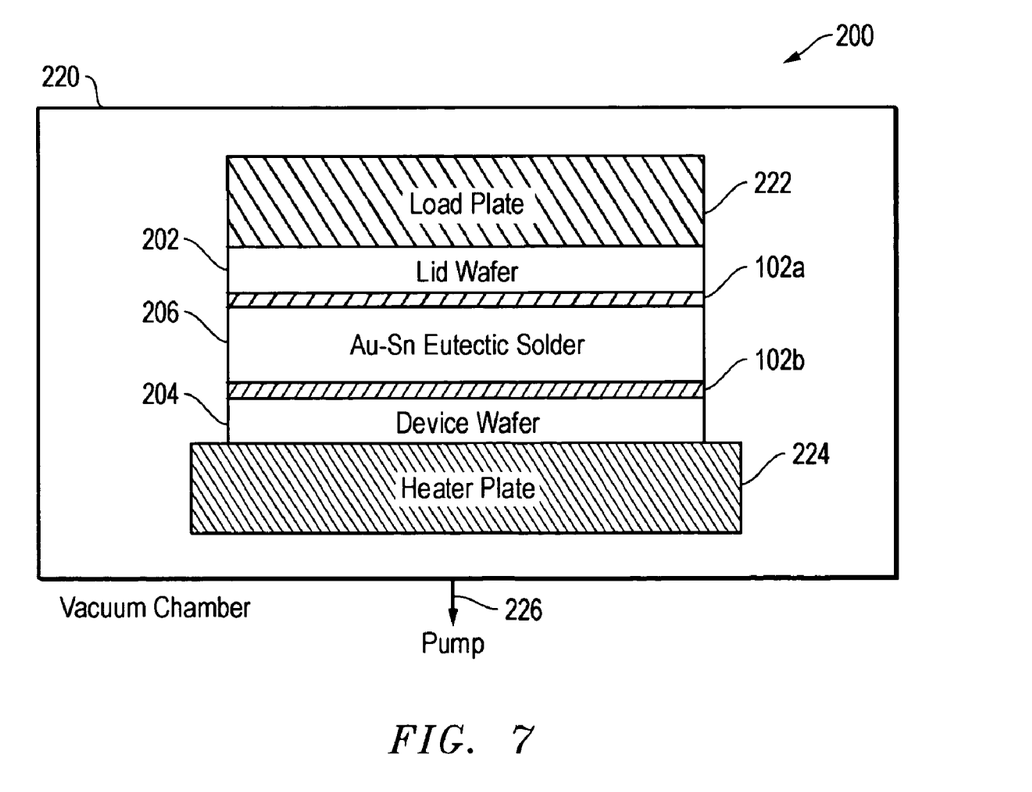
FIG. 7 is a simplified schematic of a vacuum bonding system setup according to one exemplary embodiment of the disclosed systems and methods.

FIGS. 6 and 7 illustrate aspects of an isothermal wafer bonding process according to one embodiment of the disclosed systems and methods. In particular, FIG. 6 is a simplified illustration of one exemplary embodiment of a stackup configuration 100 that is applicable to bonding of silicon wafers such as wafers 10 and 30 described hereinabove. In the illustrated embodiment, stackup configuration includes a bonding adhesion surface in the form of a metal stack 102 that is disposed on the bond surface of a silicon wafer 104, e.g., as it may be disposed on each of wafers 10 and 30 prior to bonding. As shown, metal stack 102 may include an adhesion layer 106 (e.g., titanium, titanium-tungsten alloy, or chromium), barrier layer 108 (e.g., nickel, platinum, molybdenum or palladium) and solderable top layer 110 (e.g., gold). In one embodiment, the thickness of the adhesion and barrier layers is sufficient to preclude the solder from reaching the underlying silicon wafer. For example, adhesion layer 106 may be a 1000 Angstrom thick layer of titanium, barrier layer 108 may be a 1500 Angstrom thick layer of platinum, and solderable top layer 110 may be a 7500 Angstrom thick layer of gold.

It will be understood that other metal stack configurations are possible, i.e., layer thicknesses, number of layers, and/or types of layers may vary as desired or needed to fit the requirements of a given application. For example, a solderable top layer may be present without an adhesion layer and/or without a barrier layer. In any case, it will be understood that a solderable top layer may be present as any material that is suitable for providing a surface to which a solder bond may adhere (or bond to) during a solder bonding process as described elsewhere herein. It is also possible that no solderable top layer may be required, e.g., where the surface of a component (e.g., wafer or other component) is composed of a material to which a solder bond may suitably adhere or bond to during such a solder bonding process.

FIG. 7 is a schematic of a vacuum bonding system setup 200 that may employed in the practice of one exemplary embodiment of the disclosed systems and methods. It will be understood that the embodiment of FIG. 7 is exemplary only, and that any other system and/or methodology suitable for heating a solder layer to achieve a solder bond between two or more adjacent components (in a vacuum or non-vacuum environment) may be employed in the practice of the disclosed systems and methods. As shown in FIG. 7, lid wafer 202 and device wafer 204 are to be bonded together, in this case by Au—Sn eutectic solder layer 206. In this regard, solder layer 206 may be composed of a gold-tin (Au—Sn) alloy that is near or substantially at the eutectic composition of 80% Au 20% Sn by weight. However, other alloy compositions may also be used. For example, in one exemplary embodiment employing an Au solderable layer, a solder composition of a solder layer may be pure or substantially pure tin, e.g., equal to 100% tin or equal to about 100% tin. Other examples of suitable combinations of solderable layer materials and solder layer materials include, but are not limited to, lead surfaces with tin solder, gold substrates with either lead solder or tin solder, silver coated surfaces bonded with gold-20 wt % tin, etc. Furthermore, it will be understood that a solder layer (e.g., Au—Sn composition) may alternatively be disposed on or otherwise suitably attached to a surface of each of lid wafer 202 and device wafer 204, and a solderable layer (e.g., substantially pure Au composition) disposed therebetween, i.e., such that two solder layers are employed to bond lid wafer 202 and device wafer 204 together with a solderable layer in-between.

In any event, it will be understood that the composition of a solder layer (e.g., solder layer 206) may have any composition (alloy or substantially pure metal) that has a melting point that is lower than the melting point of an alloy composition formed when an adjacent solderable layer (e.g., solderable top layer 110) is dissolved into the solder layer during the heating that occurs in a soldering process. In this regard, it will be understood that one or more of the individual layer materials of stack 102 may be selected based on the type of solder to be employed to bond the silicon wafers together, and vice-versa. Furthermore, it will be understood that a solderable layer may be present as a single layer (e.g., solderable top layer 110 may be present without barrier layer 108 and adhesion layer 106), or that any other desired or required combination of one or more layers may be present beneath a solderable top layer as may be suitable for a particular solder bonding operation.

Still referring to the exemplary embodiment of FIG. 7, lid wafer 202 may correspond, for example, to silicon lid wafer 30 of FIG. 2, and device wafer 204 may correspond, for example, to silicon device wafer 10 of FIG. 1. As further shown, a metal stack 102 (such as described in relation to FIG. 6) has been provided on the bonding surfaces of each of lid wafer 202 and device wafer 204, i.e., stack 102a is provided on bonding surface of lid wafer 202 and stack 102b is provided on bonding surface of lid wafer 204 so that the adhesion layer of each stack 102 is in contact with its corresponding wafer 202 or 204, and so that the solderable layer 110 of each stack 102 faces solder layer 206. When used to bond a lid wafer 30 to a device wafer 10, eutectic solder layer 206 may be positioned between bonding adhesion surfaces (e.g., between metal stacks 102a and 102b) of wafers 30 and 10 so as to coincide with sealing surface 16 around each MEMS device 12 of the device wafer 10.

Still referring to FIG. 7, wafers 202 and 204 are shown placed inside heated vacuum chamber 220 between load plate 222 and heater plate 224, with solder layer 206 therebetween. Although any suitable methodology may be employed, wafers 202 and 204 may be initially held apart at the edge (e.g., by knife edge arms or other suitable mechanical device), as a vacuum is established by withdrawing gas from chamber 220 with a vacuum pump or by other suitable method, as illustrated by arrow 226. After final vacuum has been established within chamber 220, lid wafer 202 and device wafer 204 are brought together, e.g., the top (lid) wafer 202 is lowered with solder layer 206 therebetween so that metal stacks 102a and 102b are placed in contact with solid solder layer 206 as shown in FIG. 7. Then the temperature within the vacuum chamber is raised above the melting point of the solder layer 206 to melt solder layer 206. At this time the top surface layer 110 of each of metal stacks 102a and 102b is dissolved into the now liquid solder layer 206 by an amount that is determined by the fact that in this equilibrium state the liquidusz temperature will be equal to the set temperature. As will be described in further detail below, the melting point of solder layer 206 is raised with dissolution of top surface layer 110 into solder layer 206, causing solder layer 206 to solidify and bond to metal stacks 102a and 102b, thus bonding lid wafer 202 and device wafer 204 together with a vacuum trapped therebetween, e.g., within the area defined inside sealing surfaces 16 and 32 of FIGS. 1, 2, 4 and 5. It will be understood that the embodiment of FIG. 7 is exemplary only, and that any other suitable bonding system apparatus may be employed including, but not limited to, systems in which a top plate (e.g., load plate) is heated in addition to, or in alternative to, a separate bottom heater plate.

Figure 8:
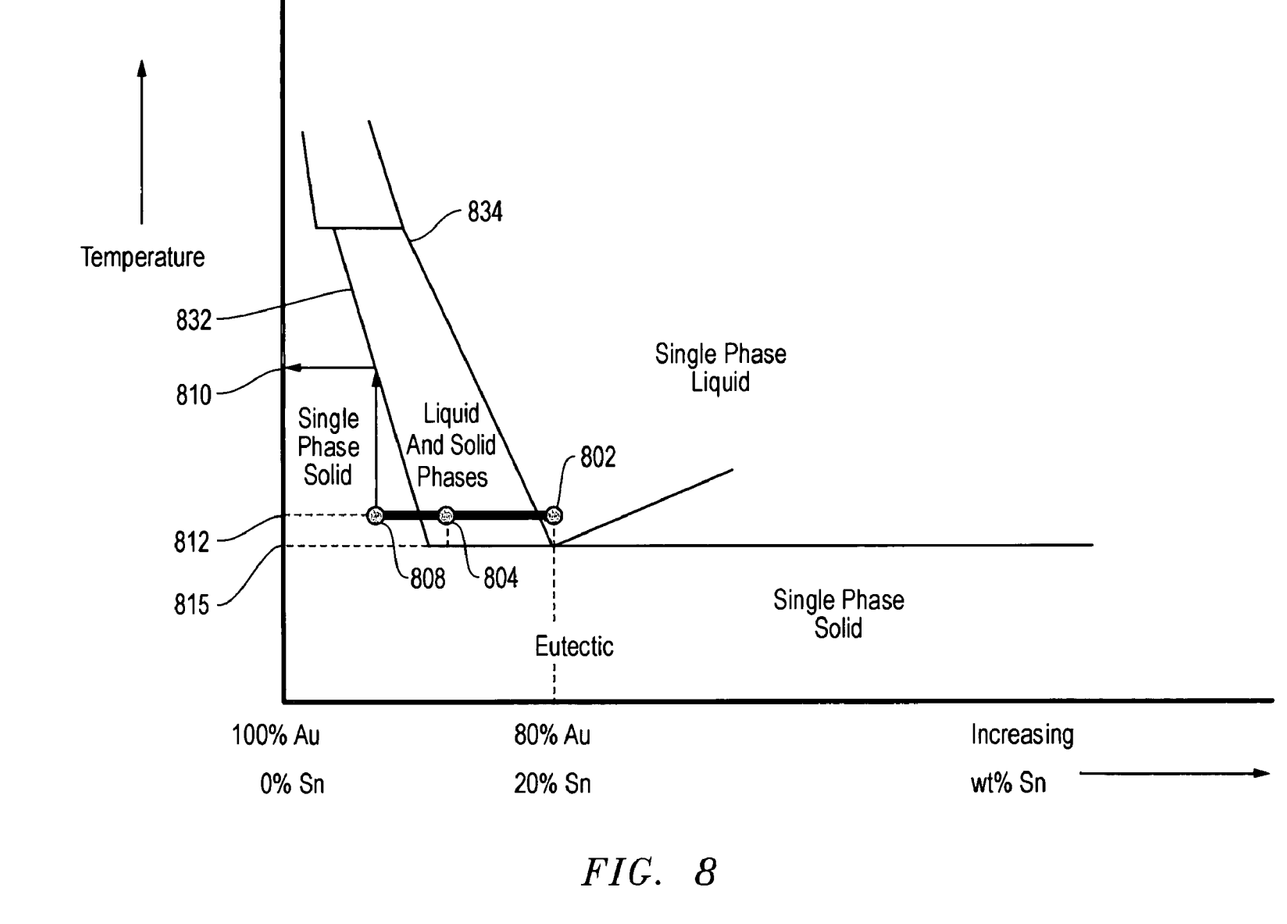
FIG. 8 is a schematic of a portion of the Au—Sn phase diagram of a solder layer during a solder bonding process according to one exemplary embodiment of the disclosed systems and methods.

FIG. 8 shows a schematic portion of the Au—Sn portion of a phase diagram of a solder layer during a solder bonding process according to one exemplary embodiment of the disclosed systems and methods (e.g., such as described in relation to FIG. 7) that uses the combination of an eutectic Au—Sn solder layer and a metal stack having a Au solderable layer. As shown in FIG. 8, a solder layer (e.g., solder layer 206 of FIG. 7) having an original eutectic composition represented by point 802 is provided (i.e., about 80% Au and about 20% Sn by weight), and this composition has a melting point of about 278° C. This solder layer may be placed in contact with an Au solderable layer (e.g., solderable layer 110 of FIG. 6) having a melting point of about 1063° C.

Next, the solder layer and solderable layer in contact with the solder layer are heated to a temperature 812 above the melting point ("M.P.") of the solder layer (e.g., to a temperature of from about 1° C. above the melting point of the solder layer to about 30° C. above the melting point of the solder layer, with the upper temperature determined by the amount of Au to be dissolved) using any suitable technique (e.g., using the solder bonding process and equipment of FIG. 7) in order to melt the Au/Sn solder layer having composition 802 (shown in FIG. 8 to be in the single phase liquid region of the Au—Sn phase diagram). It will be understood that the above temperature range for temperature 812 is exemplary only, and that solder layer and solderable layer may be heated to any suitable temperature above the melting point of the solder layer composition, e.g., including a temperature greater than about 30° C. above the melting point temperature 815 of the initial Au—Sn solder layer composition of FIG. 8.

This elevated temperature 812 is then held substantially constant for a period of time suitable to increase Au concentration of the melted solder layer until the melted solder layer solidifies to form bonding material, e.g., for a time period of from about 1-2 minutes to about 60 minutes, or for any other suitable period of time. During this time at elevated temperature 812, the solder layer first melts and the Au atoms of the adjacent and contacting solderable layer dissolve into the solder layer, increasing the Au content of the solder layer past the liquidus line 834 of the Au—Sn phase diagram, e.g., to about 90% Au and about 10% Sn, by weight, as represented by point 804 of FIG. 8. In the exemplary illustrated embodiment, this increase in Au content moves the composition of the solder layer to and past the solidus line 832 of the Au—Sn phase diagram as indicated in FIG. 8, causing the solder layer composition to solidify and form a bonding material that bonds to the solderable layer at this temperature. It will be understood that it is not necessary that elevated temperature 812 be held constant, e.g., in the illustrated embodiment an elevated temperature may be varied from above the melting point temperature of the initial eutectic Au—Sn solder layer composition up to the melting point temperature of pure Au. For example, it may be desirable to increase the temperature to accelerate the solidification process or to decrease the temperature to slow the solidification process.

Following solidification, the solderable layer and contacting solder layer may be optionally held at the same elevated temperature 812 (e.g., of from about M.P.+1° C. to about M.P.+30° C.) for an additional period of time suitable to allow additional Au atoms to continue to transfer to and migrate within the solidified bonding material, further increasing the Au content of the bonding material by diffusion to greater than about 90% Au and less than about 10% Sn, as represented by point 808 of FIG. 8, e.g., from about 15 minutes to about 60 minutes or for any other suitable period of time. During this time the Au concentration may also be allowed to homogenize within the layer of bonding material. As illustrated in FIG. 8, the Au content of the solidified (bonding material) and homogenized phase 808 is higher than in the original solder composition 802 (e.g., of solder layer 206 of FIG. 7), and therefore the melting point 810 of this solidified (bonding material) phase is higher than that of the original solder composition 802. For example, a further increase in Au content to about 91% by weight increases the melting point of the now-solidified bonding material to a final melting point 810 of about 380° C., as compared to the original 278° C. melting point of the initial solder composition.

It will be understood that the embodiment of FIG. 8 is exemplary only and that it is not necessary that the temperature of the solidified bonding material be kept elevated after first solidification of the solder layer, e.g., homogenization is not necessary. Furthermore, it is possible to employ a solder layer that is not a eutectic mixture in combination with any suitable solderable layer composition for accomplishing one or more of the bonding features of the methodology described herein. For example, an initial composition of a solder layer may contain greater amounts of tin and/or an initial composition of a solderable layer may contain greater amounts of tin than is described for the embodiment above, e.g., solder layer 206 may be substantially pure tin and/or solderable layer 110 may contain some amount of tin prior to heating, e.g., so that the tin composition of the solder layer is increased during heating in a manner that raises the melting point of the solder layer and results in solidification of the same. It is also possible that more than two metals may be present in an alloy formed during solidification and/or that a solderable layer may contain a metal that is not present in the initial composition of a solder layer, e.g., a solder layer may initially contain an Au—Sn eutectic mixture of metals and a solderable layer may initially contain substantially pure copper, such that the copper composition of the solder layer is increased during heating in a manner that raises the melting point of the solder layer and results in solidification of the same.

In one exemplary embodiment, the fact that the melting point of the bonding material is higher than the original solder composition may be used to successively bond multiple components (e.g., wafers) by applying this process several times using the same type of solder. For example, an interposer wafer (not shown) with a series of through apertures (holes) may be first bonded to a lid wafer (e.g., lid wafer 30 of FIG. 2) to create cavities over the device areas for purposes of wafer level vacuum packaging of semiconductor devices. Then the lid/interposer wafer combination may be soldered to the device wafer (e.g., device wafer 10 of FIG. 1). Such an embodiment may be implemented as part of either vacuum packaging or non-vacuum packaging processes.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A method of solder bonding, comprising bonding a first structure to a second structure by solidifying melted solder having a first composition to a solid solder having a second composition having a higher melting point temperature than said first composition; wherein said first composition of said melted solder comprises a eutectic mixture of two or more metals and wherein said second composition of said solid solder comprises a non-eutectic mixture of said two or more metals, said two or more metals comprising a first metal; and wherein said melted solder is solidified to said solid solder by dissolving additional first metal into said melted solder to increase concentration of said first metal in said melted solder to form said second non-eutectic composition and raise the melting point temperature of said melted solder to solidify said melted solder.

2. The method of claim 1, further comprising using isothermal dissolution to dissolve said first metal coated on a bond surface of each of said first and said second structures into said melted solder.

3. The method of claim 1, wherein said first structure comprises a semiconductor device structure; and wherein said second structure comprises a lid structure.

4. The method of claim 3, wherein each of said device and lid structures comprises a solderable top layer comprising said first metal; and wherein said solder is solidified by dissolving said first metal of said solderable top layer of each of said device structure and said lid structure into said solder to form said second non-eutectic composition having a higher melting point temperature than said first eutectic composition so that said second composition solidifies at a higher temperature than the melting point temperature of said first composition.

5. The method of claim 4, wherein said device and lid structures each comprise a wafer.

6. The method of claim 4, further comprising bonding said semiconductor device structure to said lid structure in a vacuum.

7. The method of claim 1, further comprising successively bonding a third structure to said second structure by again solidifying a melted solder having said first eutectic composition to a solid solder having said second non-eutectic composition a successive time, wherein said melted solder is successively solidified by again dissolving additional first metal into said melted solder to increase concentration of said first metal in said melted solder to again form said second non-eutectic composition and raise the melting point temperature of said melted solder to solidify said melted solder said successive time.

8. The method of claim 7, wherein said first structure comprises a lid wafer; wherein said second structure comprises an interposer wafer having a series of apertures; wherein said third structure comprises a device wafer having a series of device areas; and wherein said method further comprises bonding said lid wafer to said interposer wafer and then bonding said device wafer to said interposer wafer so that said apertures of said interposer wafer create cavities over said device areas of said device areas.

9. The method of claim 6, wherein said semiconductor device structure comprises at least one microelectronic device.

10. The method of claim 6, wherein said semiconductor device structure comprises at least one infrared detector device.

11. A method of vacuum packaging semiconductor devices, comprising:
providing a semiconductor device wafer and a lid wafer, said semiconductor device wafer comprising a plurality of semiconductor device areas, and each of said semiconductor device wafer and said lid wafer comprising a solderable top layer;

positioning said semiconductor device wafer adjacent said lid wafer in a vacuum with a solder layer having an initial composition being disposed therebetween, and so that said solderable top layer of said semiconductor device wafer and said solderable top layer of said lid wafer are each in contact with said solder layer;

melting said solder layer; and then solidifying said melted solder layer to bond said semiconductor device wafer to said lid wafer in said vacuum, wherein said melted solder layer is solidified by dissolving said solderable top layer of each of said device structure and said lid structure into said solder layer to form a second composition having a higher melting point temperature than the initial solder layer composition to cause said second composition of said solder layer to solidify;

wherein said solidified solder layer surrounds at least one of said semiconductor device areas to form a vacuum package around said semiconductor device area between said semiconductor device wafer and said lid wafer;

wherein said initial composition of said solder layer comprises a eutectic mixture of two or more metals and said second composition of said solder layer comprises a non-eutectic mixture of said two or more metals, one of said two or more metals comprising a first metal; and wherein said top solderable layer of each of said semiconductor device wafer and said lid wafer comprises said first metal in a concentration that is higher than a concentration of said first metal in said eutectic mixture of said initial composition of said solder layer.

12. The method of claim 11, wherein said semiconductor device comprises a microelectronic device.

13. The method of claim 11, wherein said semiconductor device comprises an infrared detector device.

14. The method of claim 11, wherein said steps of melting and solidifying are performed at a substantially constant temperature that is above a melting point temperature of said initial solder layer composition and that is below a melting point temperature of a composition of said solidified solder.

15. The method of claim 11, further comprising homogenizing a composition of said solidified solder layer at a temperature above the melting point temperature of said initial composition of said solder layer.

16. A method of solder bonding, said method comprising:

providing a first bondable component, said first bondable component having a solderable surface comprising a first solderable material and having a first melting point temperature;

providing a solder component in contact with said solderable surface of said first bondable component, said solder component comprising a solder material and having a second melting point temperature that is lower than said first melting point temperature, said solderable surface of said first bondable component being in contact with said solder component at a first temperature that is below said second melting point temperature;

raising the temperature of said solder component from said first temperature to a second temperature while said solder component is in contact with said solderable surface of said first bondable component, said second temperature being above said first melting point temperature and below said second melting point temperature;

allowing said solder component to melt while said solder component is in contact with said solderable surface of said first bondable component; and allowing at least a portion of said first solderable material to transfer at said second temperature from said solderable surface of said first bondable component to said solder component to raise the melting point temperature of said solder component to a temperature above said second temperature so that said solder component solidifies as a bonding material that bonds to said solderable surface of said first solderable component at said second temperature;

wherein said solder material of said solder component comprises a eutectic mixture of two or more metals, one of said two or more metals comprising a first metal;

wherein said first solderable material of said solderable surface of said first bondable component comprises said first metal in a concentration that is higher than a concentration of said first metal in said eutectic mixture of said solder component; and wherein said method further comprises allowing at least a portion of said first metal to transfer from said solderable surface of said first bondable component at said second temperature to said solder component to form a noneutectic mixture of said two or more metals in said solder component that has a melting point temperature above said second temperature so that said solder component solidifies as a bonding material that bonds to said solderable surface of said first bondable component at said second temperature.

17. The method of claim 16, wherein said first bondable component comprises a wafer; and wherein said solderable surface of said first bondable component comprises a solderable layer disposed on said semiconductor device wafer.

18. The method of claim 16, wherein said first solderable material of said solderable surface comprises gold; wherein said solder material of said solder component comprises a mixture of gold and tin; wherein a concentration of gold in said first solderable material is greater than a concentration of gold in said solder material; and wherein said method further comprises allowing at least a portion of said gold of said first solderable material to transfer from said solderable surface of said first bondable component at said second temperature to said solder component to form a mixture of gold and tin in said solder component that has a melting point temperature above said second temperature so that said solder component solidifies as a bonding material that bonds to said solderable surface of said first bondable component at said second temperature.

19. The method of claim 16, further comprising maintaining said bonding material of said solder component at a temperature that is above said first melting point temperature and below said second melting point temperature for a period of time sufficient to allow a concentration of materials to substantially homogenize within said bonding material.

20. The method of claim 16, further comprising:

providing a second bondable component, said second bondable component having a solderable surface comprising a second solderable material and having a third melting point temperature, said third melting point temperature being higher than said second melting point temperature and being higher than said first and second temperatures;

bringing said solder component in contact with said solderable surface of said second bondable component at the same time said solder component is in contact with said solderable surface of said first bondable component, said solderable surfaces of said first and second bondable components being in contact with said solder component at said first temperature that is below said second melting point temperature;

raising the temperature of said solder component from said first temperature to said second temperature while said solder component is in contact with said solderable surface of said second bondable component, said second temperature being above said first melting point temperature and below said second and third melting point temperatures;

allowing said solder component to melt while said solder component is in contact with said solderable surface of said second bondable component; and allowing at least a portion of said second solderable material to transfer at said second temperature from said solderable surface of said second bondable component to said solder component to raise the melting point temperature of said solder component to a temperature above said second temperature so that said solder component solidifies as a bonding material that bonds to said solderable surface of said second bondable component at said second temperature at the same time that said solder component solidifies as a bonding material that bonds to said solderable surface of said first bondable component so as to bond said first bondable component to said second bondable component;

wherein said first and second solderable materials are the same or are different materials, and wherein said first and third melting point temperatures are the same or different temperatures.

21. The method of claim 20, wherein first bondable component is bonded to said second bondable component in a vacuum environment to form a vacuum package therebetween.

22. The method of claim 20, wherein said first bondable component comprises a semiconductor device wafer, said solderable surface of said first bondable component comprising a solderable layer disposed on said semiconductor device wafer; wherein said second bondable component comprises a lid wafer, said solderable surface of said second bondable component comprising a solderable layer disposed on said semiconductor device wafer; and wherein said semiconductor device wafer comprises at least one microelectronic device.

23. The method of claim 20, wherein said first bondable component comprises a semiconductor device wafer, said solderable surface of said first bondable component comprising a solderable layer disposed on said semiconductor device wafer; wherein said second bondable component comprises a lid wafer, said solderable surface of said second bondable component comprising a solderable layer disposed on said semiconductor device wafer; and wherein said semiconductor device wafer comprises at least one infrared detector device.

24. A method of solder bonding two structure surfaces, comprising bonding a first structure surface to a second structure surface by melting a eutectic solder layer between the first and second structure surfaces and allowing interdiffusion with the first and second structure surfaces to form a non-eutectic solder layer between said first and second structure surfaces and reduce the volume fraction of melted liquid to form a solid metallurgical bond between the first and second structure surfaces while holding the first and second structure surfaces at a temperature above the initial solder melting point temperature.

25. The method of claim 24, wherein said first structure comprises a semiconductor device structure; and wherein a second structure comprises a lid structure.

26. The method of claim 25, wherein said device and lid structures each comprise a wafer.

27. The method of claim 25, further comprising bonding said semiconductor device structure to said lid structure in a vacuum.

28. The method of claim 24, further comprising successively bonding a third structure surface to said second structure surface by again melting a eutectic solder layer between the second and third structure surfaces and allowing interdiffusion with the second and third structure surfaces to form a non-eutectic solder layer between said second and third structure surfaces and reduce the volume fraction of melted liquid to form a solid metallurgical bond between the second and third structure surfaces while holding the second and third structure surfaces at a temperature above the initial solder melting point temperature.

29. The method of claim 28, wherein said first structure comprises a lid wafer; wherein said second structure comprises an interposer wafer having a series of apertures; wherein said third structure comprises a device wafer having a series of device areas; and wherein said method further comprises bonding said lid wafer to said interposer wafer and then bonding said device wafer to said interposer wafer so that said apertures of said interposer wafer create cavities over said device areas of said device areas.

30. The method of claim 27, wherein said semiconductor device structure comprises at least one microelectronic device.

31. The method of claim 27, wherein said semiconductor device structure comprises at least one infrared detector device.

* * * * *